(12) United States Patent
Mikhemar et al.

(10) Patent No.: US 12,155,522 B2
(45) Date of Patent: Nov. 26, 2024

(54) DYNAMIC ASSIGNMENT WITH PHASE-PRESERVING CLIPPING TECHNIQUE FOR DIGITAL TRANSMITTERS AND POWER AMPLIFIERS

(71) Applicant: Avago Technologies International Sales Pte. Limited, Singapore (SG)

(72) Inventors: Mohyee Mikhemar, Aliso Viejo, CA (US); Alvin Lai Lin, Andover, MA (US); Andrew J. Blanksby, Lake Oswego, OR (US); Sudharshan Srinivasan, Bangalore (IN); Ahmed Sayed, Irvine, CA (US); Wei-Hong Chen, Irvine, CA (US); Arya Behzad, Los Altos, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/132,908

(22) Filed: Apr. 10, 2023

(65) Prior Publication Data
US 2024/0340213 A1    Oct. 10, 2024

(51) Int. Cl.
*H04L 27/00*    (2006.01)
*H04L 27/36*    (2006.01)

(52) U.S. Cl.
CPC .................. *H04L 27/364* (2013.01)

(58) Field of Classification Search
CPC ..................................... H04L 27/364
See application file for complete search history.

(56) References Cited

U.S. PATENT DOCUMENTS 6,879,642 B2    4/2005    Taskinen
2023/0054999 A1*    2/2023    Chakraborty .......... G01R 27/28

OTHER PUBLICATIONS

Buckel T et al: "A Novel Hybrid Polar-I/Q 1-15 Modulation Method relaxing RF Phase Modulator Design Requirements", 2018 14th Conference On Ph.D. Research in Microelectronics and Electronics (Prime), IEEE, Jul. 2, 2018 (Jul. 2, 2018), pp. 181?184, XP033382773, DOI: 10.1109/PRIME.2018.8430325 [retrieved on Aug. 8, 2018] * sections III, IV; figure 1c *.
European Search Report on non-Foley case related to U.S. Appl. No. 18/132,908 dated Sep. 6, 2024.
Jin Hadong et al: "Efficient Digital Quadrature Transmitter Based on IQ Cell Sharing", IEEE Journal of Solid-State Circuits, IEEE, USA, vol. 52, No. 5, Feb. 6, 2017 (Feb. 6, 2017), pp. 1345-1357, XP011646411, ISSN: 0018-9200, DOI: 10.1109/JSSC.2017.2655058 [retrieved on Apr. 21, 2017] the whole document.

* cited by examiner

*Primary Examiner* — Rahel Guarino
(74) *Attorney, Agent, or Firm* — Foley & Lardner LLP

(57) ABSTRACT

A transmitter includes a first digital-to-analog converter (DAC) circuit consisting of a first set of unary cells to mix a first set of digital input data with a first clock signal. A second DAC circuit includes a second set of unary cells to mix a second set of digital input data with a second clock signal. A third circuit provides signals to the first DAC circuit and the second DAC circuit to implement an assignment scheme to assign either an in-phase (I) component or a quadrature (Q) component to the first set of unary cells and the second set of unary cells. Based on the assignment scheme, the first set of digital input data include I-data and Q-data, and the second set of digital input data include I-data and Q-data.

20 Claims, 6 Drawing Sheets

DYNAMIC ASSIGNMENT WITH PHASE-PRESERVING CLIPPING TECHNIQUE FOR DIGITAL TRANSMITTERS AND POWER AMPLIFIERS

TECHNICAL FIELD

The present description relates generally to data communications including, for example, a dynamic assignment with phase-preserving clipping technique for digital transmitters and power amplifiers.

BACKGROUND

Radio frequency (RF) digital transmitters and power amplifiers may include, among other blocks, digital-to-analog converter (DAC) circuits. In a conventional RF DAC, two separate DACs are used for in-phase (I) and quadrature (Q) signals. The I and Q signals have the same frequency but a 90-degree phase difference. The I-DAC circuit receives a digital I-input data and mixes the I-input data with a corresponding I-clock signal ($I_{clk}$) to generate an analog I-RF output signal. Similarly, the Q-DAC circuit, receives a digital Q-input data and mixes the digital Q-input data with a corresponding clock signal ($Q_{clk}$) to generate an analog Q-output signal, which is combined with the analog I-output signal to form the analog I/Q output signal for transmission.

In conventional I and Q-DAC circuits, the I and Q assignments are static, unary cells (e.g., thermometer based rather than binary) of the RF DACs for a quadrature amplitude modulation (QAM) are equally divided into I and Q unary cells and clipping (e.g., cutting off) applies to I and Q-data separately. For example, the 64 cells of the RF DACs are divided into 32 I and 32 Q unary cells. In practice, a circular shape may be used represent a constellation and any data beyond I=32 or Q=32 is clipped. For the example 64-unary cell constellation, with −32<I<32 and −32<Q<32, the largest circle that can be fitted and supported would have a radius of 32, and the clipping is automatically applied at I=32 and Q=32, which would limit the transmit power.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to a dynamic assignment scheme with a phase-preserving clipping technique for digital transmitters and power amplifiers. The subject technology uses digital hardware to configure each RF cell of a digital transmitter to transmit either I or Q signals for each sample based on the value of a summation of I and Q samples to increase the output power and consequently the transmission range. The disclosed technique, instead of clipping I and Q signal magnitudes that limits output power, clips the I+Q signal magnitudes, which results in supporting about 3 dB higher output power with about 50% duty cycle clocks. The subject technology scales I and Q magnitudes with the same factor to keep the I/Q ratio preserved; hence the phase of the signal is not distorted. The phase-preserving clipping achieves lower error-vector magnitude (EVM) than the conventional clipping of I and Q magnitudes separately.

Figure 1:
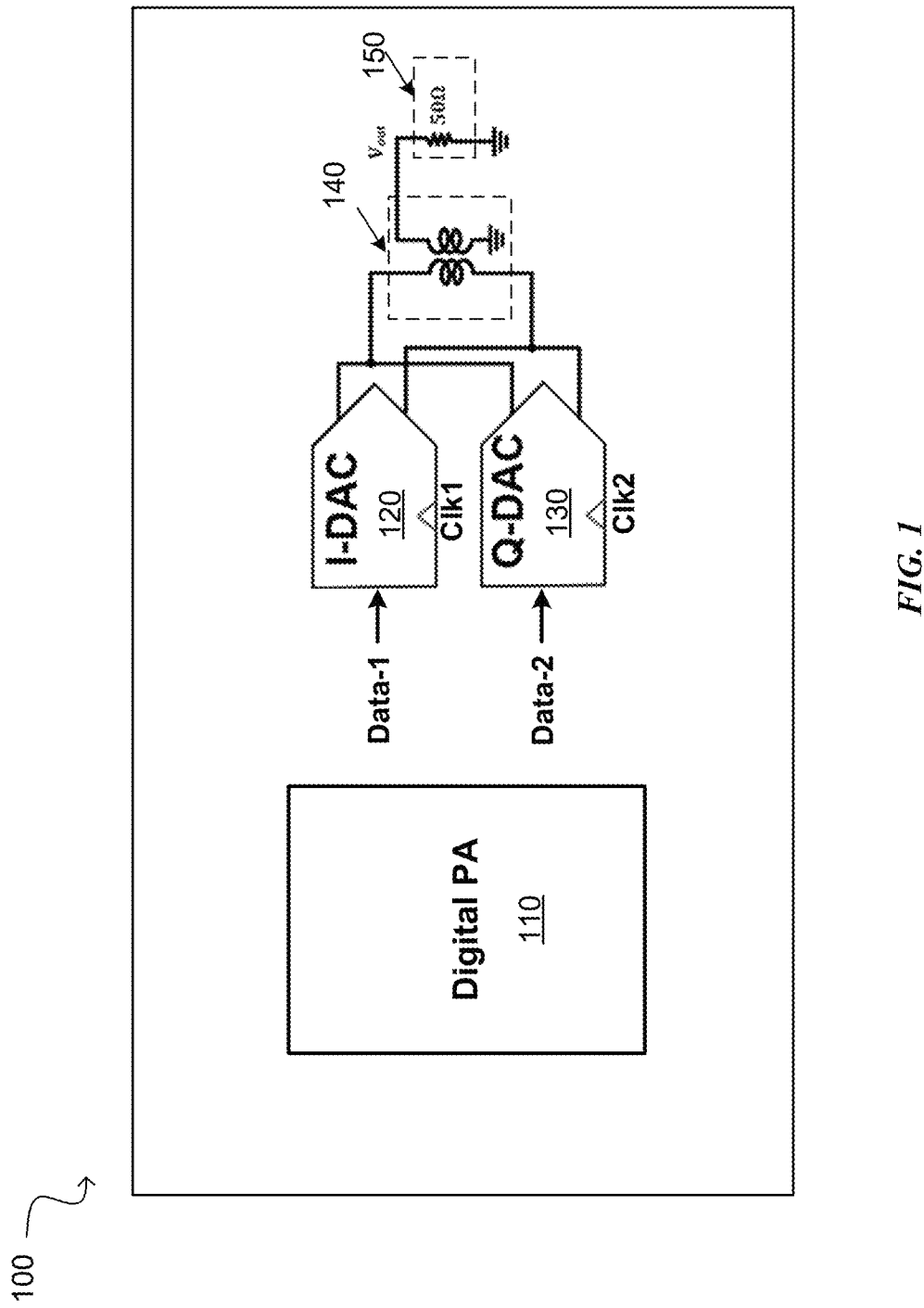
FIG. 1 is a block diagram illustrating an example of a digital circuit within which some aspects of the subject technology are implemented.

FIG. 1 is a block diagram illustrating an example of a digital circuit 100 within which some aspects of the subject technology are implemented. In some embodiments, the digital circuit 100 can be a digital RF circuit; for example, a digital transmit (TX) circuit. The digital circuit 100 includes, but is not limited to, a digital power amplifier (PA) circuit 110, an I-DAC 120, a Q-DAC 130, a combiner circuit 140, and a load 150. In some embodiments, the digital PA circuit 110 is a PA circuit that includes logic circuits and codes, which can amplify a digital input signal. The digital input signal can, for example, be a digital RF signal which is amplified by the digital PA circuit 110. In some embodiments, the I-DAC 120 is a DAC circuit that can mix a first digital data (Data-1) with a first clock (Clk1) and produce a first analog signal. The mixing, in the context of the present discussion includes multiplying two signals, for example, an RF signal by a local oscillator (LO) signal. In the case of I-DAC 120, the RF signal is the first digital data (Data-1) and the LO signal is the first clock (Clk1). In one or more embodiments, the Q-DAC 130 is a DAC circuit that can mix a second digital data (Data-2) with a second clock (Clk2) and produce a second analog signal.

In one or more embodiments, the combiner circuit 140 is a circuit (e.g., a transformer) that can combine the first analog signal with the second analog signal to generate a mixed analog signal for delivery to the load 150 (e.g., a resistor, e.g., a 50-Ohm resistor).

In a conventional I and Q-DAC circuit, the first digital data (Data-1) is a I-data and the second digital data (Data-2) is a Q-data. Furthermore, the first clock is a I-Clk and the second clock is a Q-Clk, and the first and second analog signals are analog I and Q signal, respectively. Conventional I- and Q-DAC circuits use a static I and Q assignment technique. In the static I and Q assignment technique, unary cells of the I and Q-DAC circuit are equally divided into I and Q unary cells; for example, the 64-unary cells are divided into 32 I and 32 Q unary cells, and clipping is applied separately to magnitude of I and Q-data.

For the disclosed I and Q-DAC circuit, the first digital data (Data-1) and the second digital data (Data-2) are both I and Q-data, and the first clock (Clk1) the second clock (Clk2) are the same and include I and Q-Clk, as described in more detailed herein. The subject technology uses a dynamic I and Q assignment scheme and the clipping is not applied separately to magnitude of I and Q-data. Rather, clipping is applied to the summation of I and Q magnitudes, as further explained herein. This allows supporting about 3 dB higher output power with about 50% duty cycle clocks. Furthermore, the disclosed dynamic assignment scheme with a phase-preserving clipping technique achieves a better EVM as compared to the conventional separate I and Q clipping technique. In some embodiments, the phase-preserving clipping preserves the phase by not clipping the phase.

In some embodiments, the dynamic I/Q assignment for unary cells allows each DAC cell function either as an I-DAC or a Q-DAC depending on the signal transmitted. The DAC cells are ordered in such a way that the endianness of the I-data is opposite that of the Q-data. For example, the unary least significant bit (LSB) for the I-data is the unary most significant bit (MSB) of the Q-data. This reverse map ordering is necessary to reduce the amount of clipping to be applied. If the sum of the I-data and the Q-data is less than or equal to the number of DAC cells, then there is no dynamic assignment conflict. However, if the sum of the I-data and the Q-data is greater than the number of DAC cells, there is no longer enough cells to represent the signal and a clipping technique has to be applied.

Figures 2A, 2B:
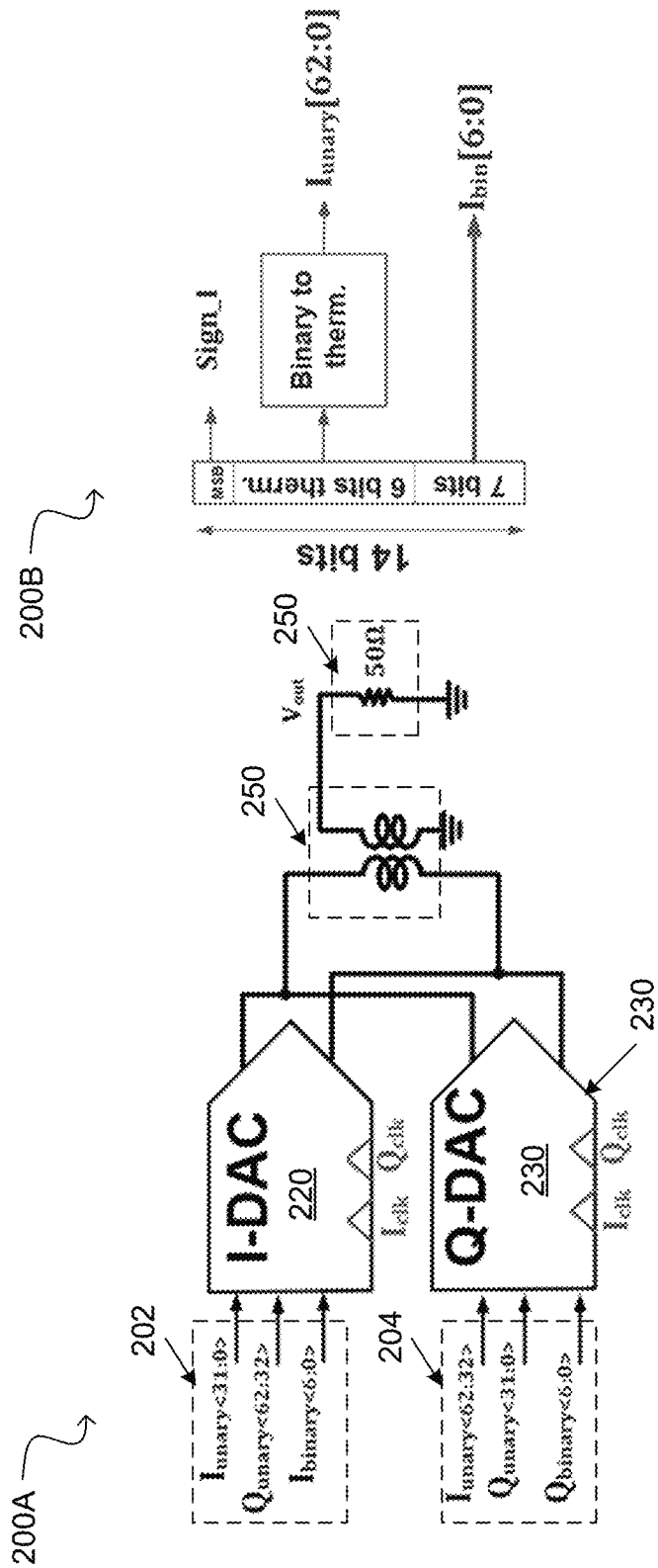
FIGS. 2A and 2B are a schematic diagram illustrating an example of a digital transmit I/Q DAC architecture with a dynamic I and Q assignment scheme and a corresponding bit assignment chart, according to aspects of the subject technology.

FIGS. 2A and 2B are a schematic diagram illustrating an example of a digital TX I- and Q-DAC architecture 200A with a dynamic I and Q assignment scheme and a corresponding bit assignment chart 200B, according to aspects of the subject technology. The digital TX I- and Q-DAC architecture 200A (hereinafter, digital TX architecture 200A) is an integrated circuit, which includes, but is not limited to, an I-DAC 220, a Q-DAC 230, the combiner circuit 240 (e.g., a transformer) and the load 250 (e.g., a 50-Ohm resistor). In some embodiments, suitable mixer circuits (e.g., a first circuit and a second circuit) can be used to implement some or all the functionalities of the I-DAC 220 and the Q-DAC 230, for example, operate on the first set of data and the second set of data, respectively. In some aspects, the terms "a first DAC" and "a second DAC" used in the claims, respectively, refer to the I-DAC 220 and the Q-DAC 230.

In some embodiments, the I-DAC 220 is a DAC circuit that receives a first set of digital I/Q input data 202 and I/Q clock (e.g., $I_{clk}$ and $Q_{clk}$) signals and mixes the first set of digital I/Q input data 202 with the I/Q clock signals to generate a first I/Q analog signal. In some aspects, the $I_{clk}$ signal and the $Q_{clk}$ signal are also referred to as a first clock signal and the second clock signal. In one or more embodiments, the Q-DAC 230 is a DAC circuit that receives a second set of digital I/Q input data 204 and I/Q clocks (e.g., $I_{clk}$ and $Q_{clk}$) and mixes the second set of digital I/Q input data 204 with the I/Q clocks to generate a second I/Q analog signal. In some embodiments, the combiner circuit 240 is a circuit that can combine the first I/Q analog signal with the second I/Q analog signal and generate a mixed analog signal for delivery to the load 250, where RF signals (e.g., I RF output and Q RF output) are generated. Each of the I-DAC 220 and the Q-DAC 230 include a number of (e.g., 64) unary cells, also referred to as the first set of unary cells and the second set of unary cells, respectively. Each unary cell is capable of operating on (processing) I or Q components at different times, based on the clocks operating in accordance with a 50% duty cycle. The first set of unary cells and the second set of unary cells may include shared elements. In some embodiments, each of the I and Q components include I- and Q-data and I- and Q-clock signals.

In some embodiments, the first set of digital I/Q input data 202 includes first unary I ($I_{unary}$) and Q ($Q_{unary}$) data and binary I-data (e.g., binary I bits), and the second set of digital I/Q input data 204 includes second unary I and Q-data and binary Q-data (e.g., binary Q bits). In some aspects, the first unary I- and Q-data consist of 63 bits (0-62), for example, bits 0-31 (e.g., I-bits) are assigned to unary I ($I_{unary}$) and bits 32-62 (e.g., Q-bits) are assigned to unary Q ($Q_{unary}$), and the binary I-data ($I_{binary}$) consists of 7 bits. In one or more aspects, the second unary I- and Q-data consist of 63 (0-62) bits; for example, bits 0-31 are assigned to unary Q ($Q_{unary}$) and bits 32-62 are assigned to unary I ($I_{unary}$), and the binary Q-data ($Q_{binary}$) consists of 7 bits (0-6). The clock signals, $I_{clk}$ and $Q_{clk}$, are similar to the conventional I and Q clocks.

The I-DAC 220 mixes the unary and binary I-data with the $I_{clk}$ and the unary Q-data with the $Q_{clk}$ to generate a first analog mixed signal. Similarly, the Q-DAC 230 mixes the unary I-data with the $I_{clk}$ and the unary and binary Q-data with the $Q_{clk}$ to generate a second analog mixed signal. The first analog mixed signal and the second analog mixed signal are combined by the combiner circuit 240 to form an analog signal to be delivered to the load 250. With the disclosed I-DAC architecture, all the unary cells can be dynamically assigned to transmit either I or Q-data. In some embodiments, a third circuit (e.g., control circuit) implements the dynamic assignment scheme by assigning either I-data or Q-data to a unary cell of the I-DAC 220 or the Q-DAC 230. In some embodiments, the third circuit sends signals to the I-DAC 220 or the Q-DAC 230 to implement the dynamic assignment. Beneficially, the unary cells can be dynamically assigned I-data or Q-data in real-time or near real-time, which can reduce phase-clipping and/or increase power output.

The bit assignment chart 200B shows the configuration of an example 14-bit data, which includes a sign bit that is normally the most significant bit (MSB), 6 thermometer (therm) bits (equivalent to 63 unary bits) and 7 binary bits (e.g., for $I_{binary}$ or $Q_{binary}$).

In some aspects, a PA circuit (e.g., a digital PA circuit) can be implemented similar to the digital TX 200A and include a first DAC circuit and a second DAC circuit similar to the I-DAC 220 or the Q-DAC 230 with similar functionalities as described above, respectively.

Figure 3B:
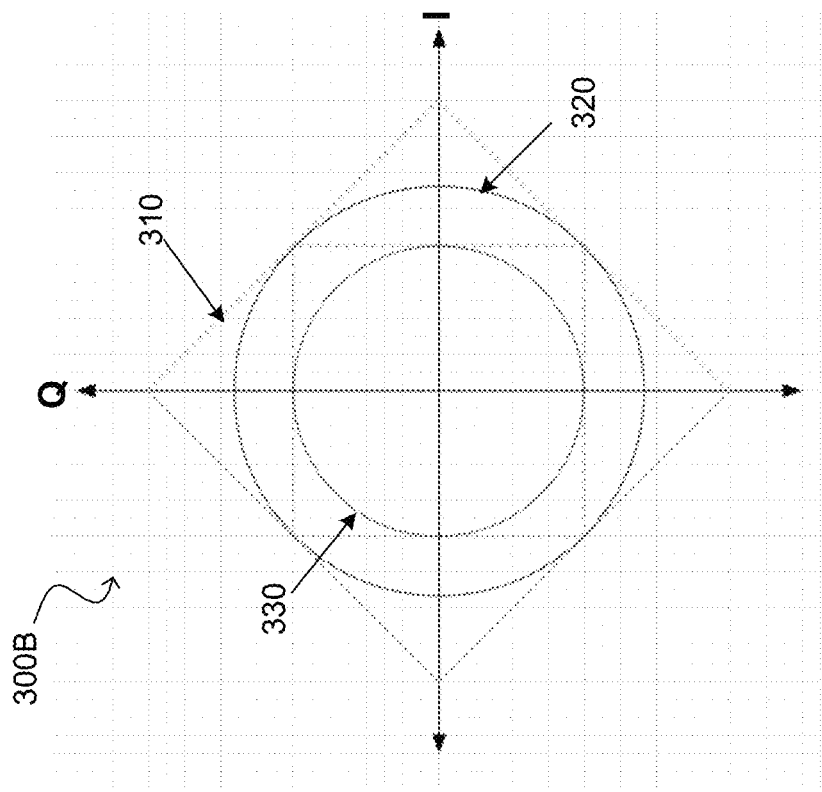
FIGS. 3A and 3B are diagrams illustrating a QAM constellation associated with a dynamic I and Q assignment scheme and a comparison chart, according to aspects of the subject technology.
Figure 3A:
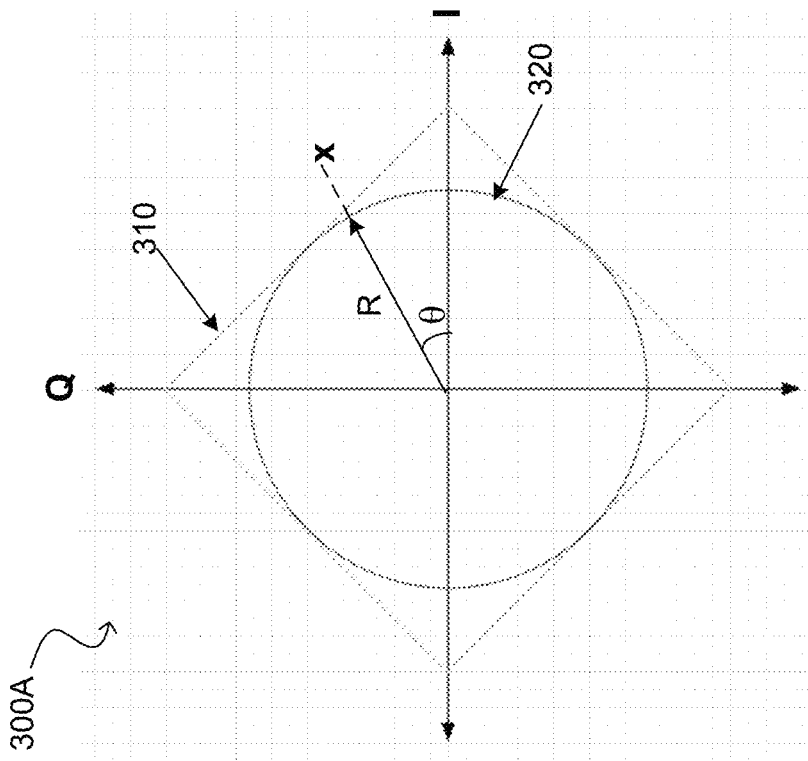

FIGS. 3A and 3B are diagrams illustrating a QAM constellation 300A associated with a dynamic I and Q assignment scheme and a comparison chart 300B, according to aspects of the subject technology. The QAM constellation 300A shows a square 310 surrounding a circle 320, which is the practical constellation of the dynamic I and Q data. Each side of the square 310 is a straight line, in the cartesian I and Q coordinates, which is the locus of points with I+Q=constant. In this case, the constant is the radius R of the circle 320. For example, if the I and Q magnitudes are constrained by the straight line of I+Q=64, the circle 320 would be the largest circle that can be fit in the square 310 and the radius $$R = 32\sqrt[2]{2} = 45.2.$$

The clipping characterized by I+Q=constant, in the dynamic I and Q assignment scheme preserves the phase. For example, a data point x with a magnitude larger than R and a phase θ is substituted with a data point on the circle 320 with a magnitude of R and the original phase θ. In some embodiments, in order to have the clipping preserve the phase, the subject technology scales the values of the of the I- and Q-data magnitudes with the same scale factor to prevent phase distortion. In some embodiments, the scale factor is determined by dividing a value of a code-limit parameter by a value of the summation. For example, if the value of the magnitude of I-data (mag (I)) plus the magnitude of Q-data (mag(Q)) is greater than a value of the code-limit parameter (max_code), the scale factor is determined as follows:

scale factor=max_code/(mag(Q)+mag(I))  (1)

and the clipped magnitude values ($I_{clipped}$ and $Q_{clipped}$) of the I and Q magnitudes are determined as follows:

$I_{clipped}$=I*scale factor  (2)

$Q_{clipped}$=Q*scale factor  (3)

The phase-preserving clipping of the subject technology achieves an improved EVM as compared to the clipping of I and Q separately in the conventional static I and Q assignment.

The comparison chart 300B shows the square 310 and the circle 320 of FIG. 3A, which are associated with the disclosed dynamic assignment scheme, and a circle 330. The circle 330 represents a conventional constellation with static I and Q assignment. For example, in a 64-unary cell DAC circuit and a corresponding constellation, with −32<I<32 and −32<Q<32, the clipping is automatically applied at threshold values, e.g., I=32 and Q=32 and the largest circle (330) that can be fitted and supported would have a radius of 32 that is smaller than the radius R of the corresponding dynamic assignment scheme of the subject technology by a factor of $$\sqrt[2]{2},$$

which translate into $$3 \text{ dBm}(10\log\sqrt[2]{2} = 20)$$

when related to power. The threshold value for the summation of I- and Q-data, used in the dynamic assignment, is larger by a factor of $$\sqrt[2]{2}$$

as well. For example, in a digital TX with a $P_{max}$=+12 dBm, with the conventional static assignment of I- and Q-data, an average power of unlipped modulation and coding scheme 7 (MCS7) signal is limited to $P_{ave}$=0 dBm. However, with the dynamic I and Q assignment scheme of the subject technology, the same digital TX can transmit an unclipped $P_{ave}$=3 dBm, which is a 3 dB extra output power with the same matching and small power consumption.

Figures 4A, 4B:
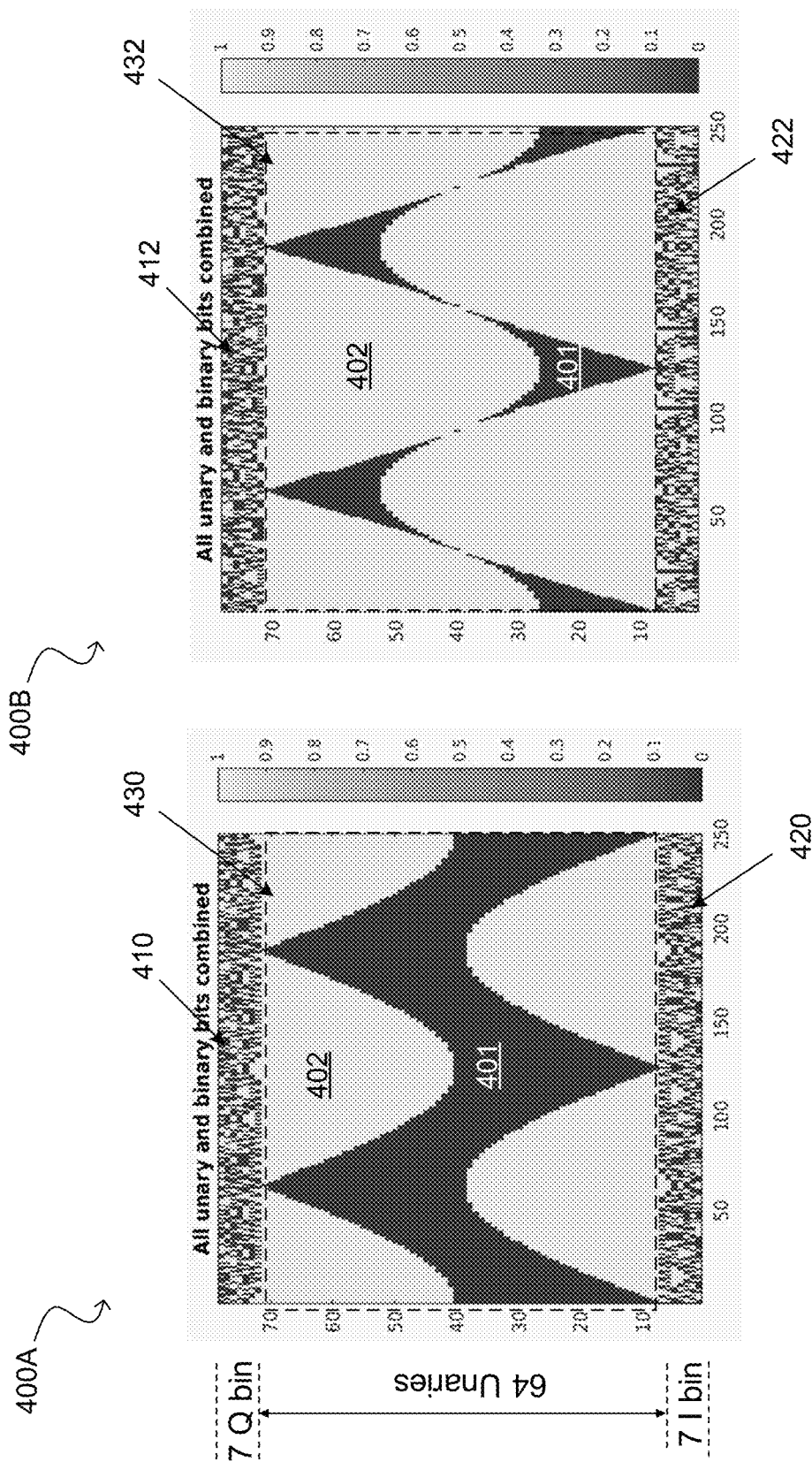
FIGS. 4A and 4B are charts illustrating a single sideband (SSB) tone bit assignment associated with static and dynamic I and Q assignments, respectively, according to aspects of the subject technology.

FIGS. 4A and 4B are charts 400A and 400B illustrating a single sideband (SSB) tone bit assignment associated with static and dynamic I and Q assignments, respectively, according to aspects of the subject technology. The chart 400A depicts a tone bit assignment associated with the conventional static I and Q assignment in a SSB modulation transmitter. The chart 400B shows a tone bit assignment associated with the disclosed dynamic I and Q assignment scheme in the same SSB modulation transmitter. The vertical and horizontal axes of the charts 400A and 400B represent number of bits and I/Q magnitudes, respectively. The top portions 410 and 412 and bottom portions 420 and 422 represent 7 binary Q and 7 binary I-data, respectively. The middle portions 430 and 432 represent the 64 unary bits. Regions 401 and 402 of the middle portions 430 and 432 of the charts 400A and 400B represent "1" and "0" bits, respectively.

Comparison of the charts 400A and 400B reveals the nearly 3 dB higher transmit power of the SSB digital transmitter using the disclosed dynamic I and Q assignment scheme (chart 400B) as compared to the same transmitter using the conventional static I and Q assignment. In this example, there are 64 unary cells and the static assignment (chart 400A) requires the unary cells to be divided into an allocation of 32 cells for I and 32 cells for Q. The binary cells for either I or Q collectively represent a magnitude equal to a unary cell minus a single binary LSB; thus, the magnitude of the collection of binary cells for either I or Q can be considered approximately equal to the magnitude of a single unary cell. Therefore, the static assignment demonstrates an amplitude of 33 unary cells for the SSB tone. In the version with dynamic assignment (chart 400B), some of the unary cells are dynamically assigned to I or Q depending on the data. In this picture, these dynamically assigned unary cells have indices between 27 and 52. This technique allows the SSB tone amplitude to increase compared to the static assignment case. Chart 400B shows the SSB tone reaching an amplitude of 46 unary cells. This represents a power increase of approximately 3 dB compared to the static assignment case. The SSB tone is a special case, as can be seen in FIG. 4B, since the high magnitude of I corresponds to a low magnitude of Q and vice versa due to the 90 degree phase shift between I and Q. This allows the SSB tone to achieve especially high output power compared to signals that do not have this characteristic. The dynamic assignment technique is also well suited for signals with high peak to average power ratio (PAPR), such as signals corresponding to orthogonal frequency-division multiplexing (OFDM) systems and/or higher order constellations. In such systems, the signal power can be increased since the relatively rare peaks can be handled by dynamically reassigning unary cells when either I or Q is peaking.

Figure 5:
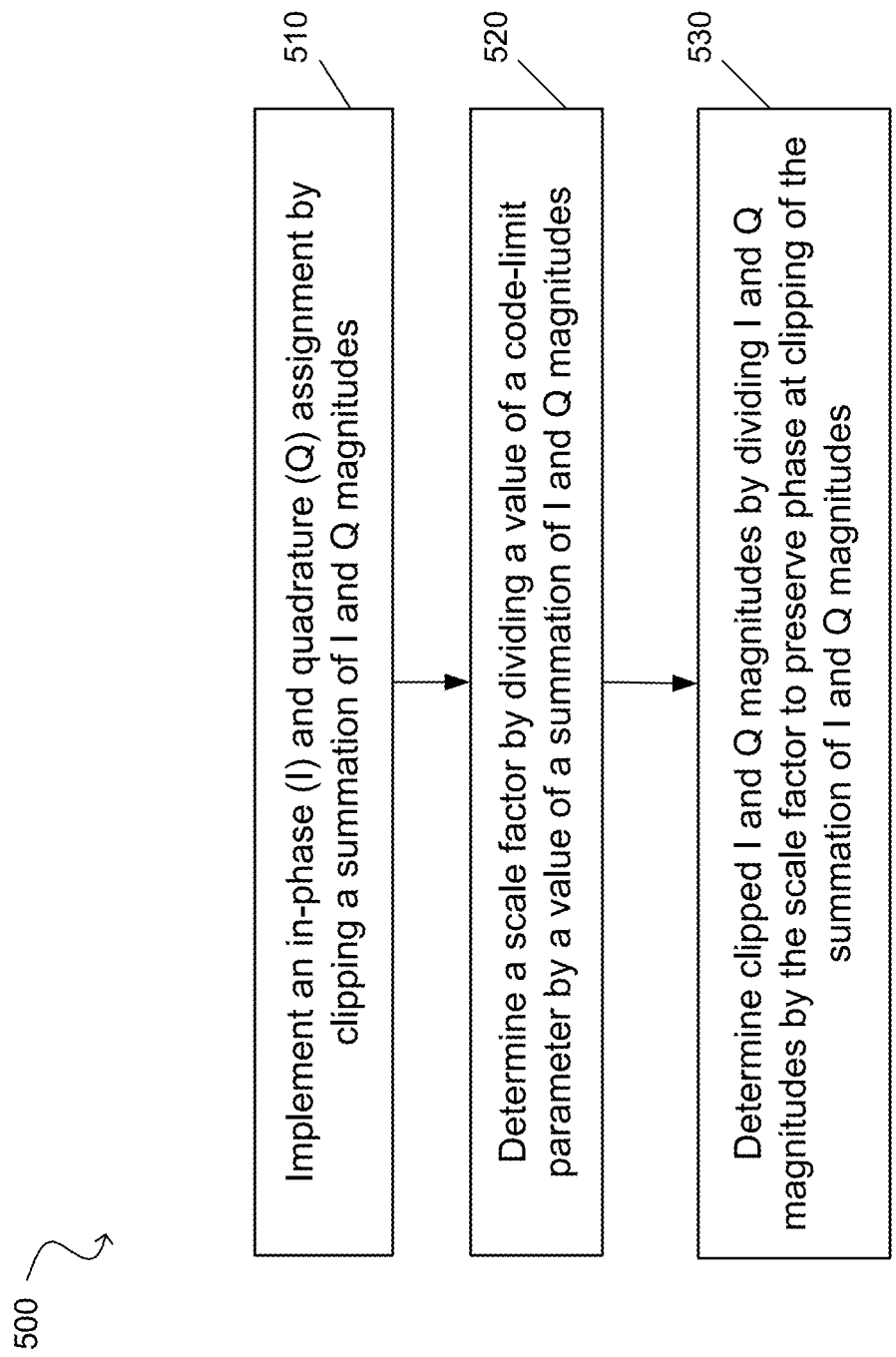
FIG. 5 is a flow diagram illustrating an example of a process for a dynamic I and Q assignment scheme with phase-preserving clipping, according to aspects of the subject technology.

FIG. 5 is a flow diagram illustrating an example of a process 500 for an I and Q assignment scheme with phase-preserving clipping, according to aspects of the subject technology. The process 500 includes implementing an I and Q assignment scheme in a digital TX (e.g., 100 of FIG. 1) or digital PA circuit (e.g., 110 of FIG. 1) by clipping a summation of I and Q magnitudes (e.g., as shown in FIG. 3A) (510). The process 500 also includes determining a scale factor (e.g., as in expression 1 at page 7) by dividing a value of a code-limit parameter (e.g., a max_code) by a value of a summation of I and Q magnitudes (520). Furthermore, clipped I and Q magnitudes are determined by dividing I and Q magnitudes by the scale factor to preserve phase (e.g., as explained with respect to FIG. 3A) at clipping of the summation of I and Q magnitudes (530).

Figure 6:
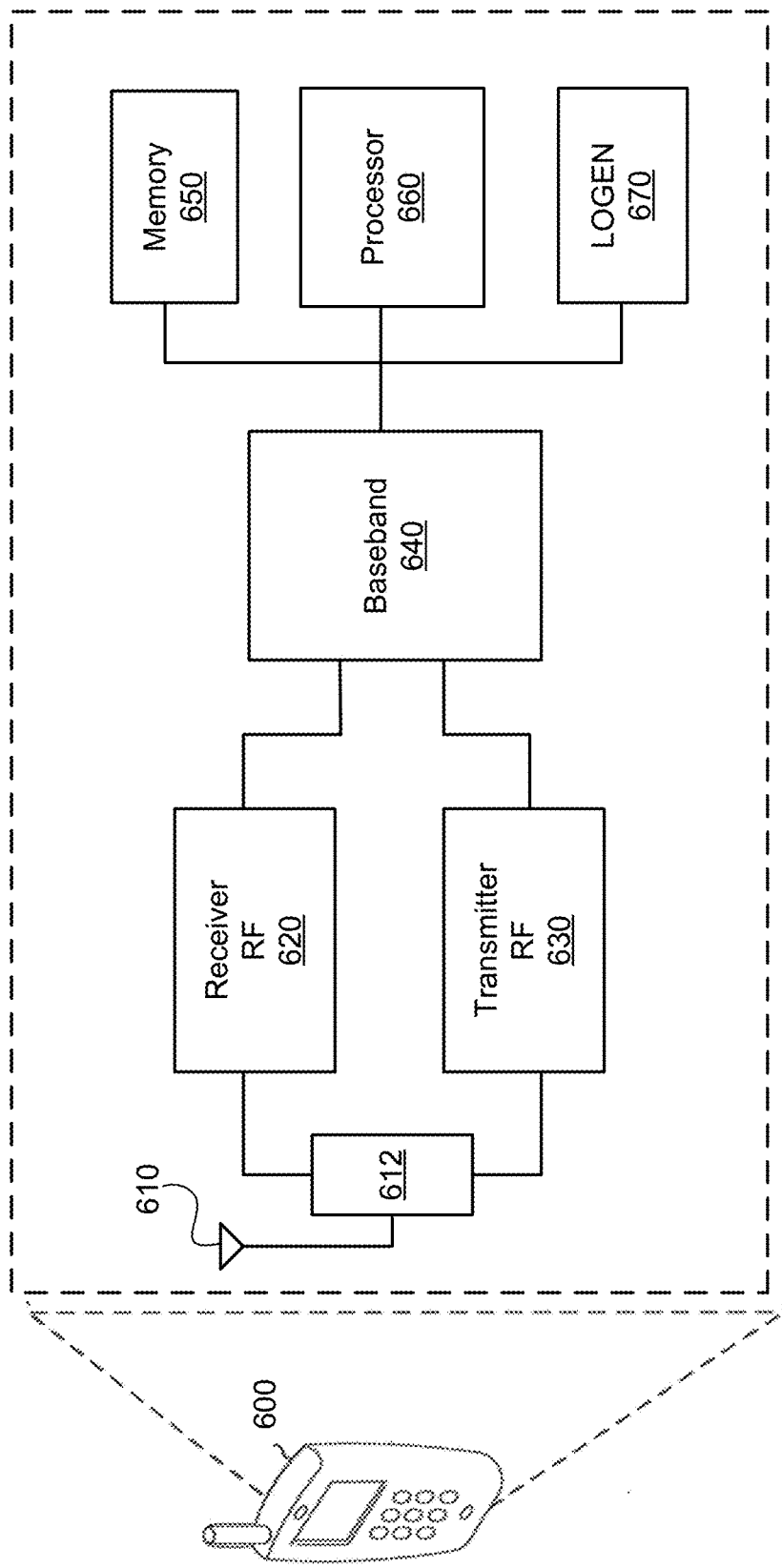
FIG. 6 illustrates an example of a wireless communication device within which some aspects of the subject technology are implemented.

FIG. 6 illustrates an example of a wireless communication device 600 within which some aspects of the subject technology are implemented. In one or more implementations, the wireless communication device 600 can be a tablet, a smartphone, a smartwatch, or other electronic device that includes a pressure sensor. The wireless communication device 600 may comprise an RF antenna 610, a duplexer 612, a receiver 620, a transmitter 630, a baseband processing module 640, a memory 650, a processor 660, and a local oscillator generator (LOGEN) 670. In various aspects of the subject technology, one or more of the blocks represented in FIG. 6 may be integrated on one or more semiconductor substrates. For example, blocks 620-670 may be realized in a single chip, a single system on a chip, or in a multichip chipset.

The receiver 620 may comprise suitable logic circuitry and/or code that may be operable to receive and process signals from the RF antenna 610. The receiver 620 may, for example, be operable to amplify and/or down convert received wireless signals. In various aspects of the subject technology, the receiver 620 may be operable to cancel noise in received signals and may be linear over a wide range of frequencies. In this manner, the receiver 620 may be suitable for receiving signals in accordance with a variety of wireless standards such as Wi-Fi, WiMAX, BT, and various cellular standards. In various aspects of the subject technology, the receiver 620 may not use any sawtooth acoustic wave filters, and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to upconvert baseband signals to RF signals and amplify RF signals. In various aspects of the subject technology, the transmitter 630 may be operable to upconvert and amplify baseband signals processed in accordance with a variety of wireless standards. Examples of such standards may include Wi-Fi, WiMAX, BT, and various cellular standards. In various aspects of the subject technology, the transmitter 630 may be operable to provide signals for further amplification by one or more power amplifiers. In some implementations, the transmitter 630 or one or more power amplifiers of the transmitter 630 may implement the dynamic I and Q assignment scheme with phase preserving clipping of the subject technology, as described above with respect to FIGS. 2A, 3B, and 4B to benefit from the higher transmit power capabilities of the disclosed technique.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receive band. The duplexer 612 may be operable in multiple frequency bands of various wireless standards.

The baseband processing module 640 may comprise suitable logic, circuitry, interfaces, and/or code that may be operable to perform the processing of baseband signals. The baseband processing module 640 may, for example, analyze received signals, and generate control, and/or feedback signals for configuring various components of the wireless communication device 600, such as the receiver 620. The baseband processing module 540 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control the transfer of data between various portions of the wireless communication device 600. Additionally, the processor 660 may enable implementation of an OS or otherwise execute code to manage operations of the wireless communication device 600. In one or more implementations, the processor 660 may be interfaced with the transducer modules via standard host interface technologies such as an inter-integrated circuit (I2C), a serial interface protocol (SPI), a peripheral component interconnect express (PCIE), a universal asynchronous receiver-transmitter (UART), and/or other interface technologies, depending on the data rate needed to sample and pipe from the transducers module to the processor 660.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various aspects of the subject technology, information stored in the memory 650 may be utilized for configuring the receiver 620 and/or the baseband processing module 640.

The LOGEN 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals, and/or sinusoidal signals. Characteristics of the oscillating signals such as the frequency and duty cycle, may be determined based on one or more control signals from, for example, the processor 660 and/or the baseband processing module 640.

In operation, the processor 660 may configure the various components of the wireless communication device 600 based on a wireless standard according to which it is designed to receive signals. Wireless signals may be received via the RF antenna 610, amplified, and down converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 600, data to be stored to the memory 650, and/or information affecting, and/or enabling operation of the wireless communication device 600. The baseband processing module 640 may modulate, encode, and perform other processing on audio, video, and/or control signals to be transmitted by the transmitter 630 in accordance with various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only, and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor is being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to one or more aspects, and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to one or more configurations, and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known, or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise", as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A transmitter, comprising:
a first circuit comprising a first set of unary cells;
a second circuit comprising a second set of unary cells; and
a third circuit configured to provide signals to the first circuit and the second circuit to implement an assignment scheme to assign either an in-phase (I) component or a quadrature (Q) component to the first set of unary cells and the second set of unary cells.

2. The transmitter of claim 1, wherein each of the first circuit and the second circuit is configured to receive I-data and Q-data.

3. The transmitter of claim 2, wherein:
the first circuit comprises an in-phase digital-to-analog converter (I-DAC) circuit, and
the second circuit comprises quadrature digital-to-analog converter (Q-DAC) circuit.

4. The transmitter of claim 3, wherein the I-DAC circuit is configured to mix the I-data with an I-clock to generate I radio frequency (RF) output.

5. The transmitter of claim 3, wherein the Q-DAC circuit is configured to mix the Q-data with a Q-clock to generate Q RF output.

6. The transmitter of claim 2, wherein the I-data comprises binary I bits and unary I and Q bits.

7. The transmitter of claim 2, wherein the first set of unary cells and the second set of unary cells include shared elements.

8. The transmitter of claim 1, wherein the assignment scheme comprises phase-preserving clipping.

9. The transmitter of claim 8, wherein the first circuit and the second circuit are configured to implement the phase-preserving clipping by clipping a summation of I-data and Q-data greater than a threshold value.

10. The transmitter of claim 9, wherein:
the first circuit and the second circuit are configured to determine the phase-preserved clipping by dividing magnitudes of the I-data and the Q-date by a scale factor, and
the scale factor is determined by dividing a value of a code-limit parameter by a value of the summation.

11. An integrated circuit comprising:
a first circuit comprising a first set of unary cells and configured to operate on a first set of data; and
a second circuit comprising a second set of unary cells and configured to operate on a second set of data, wherein:
the first set of data and the second set of data include in-phase (I) and quadrature (Q) data, and
the first circuit and the second circuit are configured to assign an in-phase I-component or a Q-component to the first set of unary cells and the second set of unary cells.

12. The integrated circuit of claim 11, wherein the first set of data and the second set of data include I-data and Q-data, and wherein the I-component and the Q-component include I-data and Q-data.

13. The integrated circuit of claim 11, wherein:
bits of the first set of data include binary I bit and unary I and Q bits, and
bits of the second set of data include binary Q bit and unary I and Q bits.

14. The integrated circuit of claim 11, wherein the first circuit and the second circuit comprise a first digital-to-analog converter (DAC) circuit and a second DAC circuit, respectively.

15. The integrated circuit of claim 11, wherein in response to an assignment scheme, a summation of the I component and the Q component is clipped.

16. The integrated circuit of claim 15, wherein the first circuit and the second circuit are configured to determine clipped-I and clipped-Q magnitudes by dividing I and Q magnitudes by a scale factor that determined by dividing a value of a code-limit parameter by a value of the summation.

17. A circuit comprising:
   a first digital-to-analog converter (DAC) circuit comprising a first set of unary cells and configured to receive a first set of digital input data; and
   a second DAC circuit comprising a second set of unary cells and configured to receive a second set of digital input data, wherein:
   the first set of unary cells and the second set of unary cells are configured to process either an in-phase (I) component or a quadrature (Q) component,
   the I component and the Q component are assigned to the first set of unary cells and the second set of unary cells.

18. The circuit of claim 17, wherein the first set of digital input data include binary I bits and unary I and Q bits, and the second set of digital input data include binary Q bits and unary I and Q bits.

19. The circuit of claim 17, wherein the I component and the Q component each comprise:
   I-data and Q-data, and
   I-clock and Q-clock signals.

20. The circuit of claim 19, wherein the I component and the Q components are assigned based on an assignment scheme that uses phase-preserving clipping.

* * * * *